United States Patent
Mu

(10) Patent No.: US 10,923,687 B2
(45) Date of Patent: Feb. 16, 2021

(54) MANUFACTURING METHOD OF DISPLAY PANEL AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Junying Mu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 23 days.

(21) Appl. No.: 16/320,391

(22) PCT Filed: Dec. 20, 2018

(86) PCT No.: PCT/CN2018/122425
§ 371 (c)(1),
(2) Date: Jan. 24, 2019

(87) PCT Pub. No.: WO2020/107579
PCT Pub. Date: Jun. 4, 2020

(65) Prior Publication Data
US 2020/0168847 A1 May 28, 2020

(30) Foreign Application Priority Data
Nov. 28, 2018 (CN) .......................... 2018 1 1437465

(51) Int. Cl.
*H01L 21/00* (2006.01)
*H01L 51/56* (2006.01)
*H01L 51/00* (2006.01)

(52) U.S. Cl.
CPC .......... *H01L 51/56* (2013.01); *H01L 51/0011* (2013.01); *H01L 51/0012* (2013.01); *H01L 51/0027* (2013.01)

(58) Field of Classification Search
CPC ... H01L 51/0011; H01L 51/56; H01L 51/0012
See application file for complete search history.

(56) References Cited

U.S. PATENT DOCUMENTS

2012/0286650 A1 11/2012 Pang et al.
2016/0254452 A1* 9/2016 Zhao .................. H01L 51/0018
438/34

FOREIGN PATENT DOCUMENTS

| CN | 101067404 A | 11/2007 |
|----|-------------|---------|
| CN | 101378107 A | 3/2009 |
| CN | 105489788 A | 4/2016 |
| CN | 106816553 A | 6/2017 |

\* cited by examiner

*Primary Examiner* — Samuel A Gebremariam

(57) ABSTRACT

A manufacturing method of a display panel and a display panel are provided. The advantages thereof are that a shadow area of an edge of a pixel caused by an angle of evaporation can be avoided and reduced, a pixel position accuracy (PPA) shift caused by raising a temperature of a fine metal mask during a coating process can be prevented, and it is applicable to manufacture of high-resolution display panels.

13 Claims, 5 Drawing Sheets

```
┌─────────────────────────────────────────────────────────────┐
│   providing a substrate having a first surface and a second surface,   │
│ wherein the first surface is disposed opposite to the second surface, and │ ⌇ S20
│   forming a plurality of deposition regions and a plurality of non-    │
│       deposition regions alternately arranged on the first surface.    │
└─────────────────────────────────────────────────────────────┘
                                    ↓
┌─────────────────────────────────────────────────────────────┐
│   providing a light source to irradiate the second surface, and further │ ⌇ S21
│        irradiate the non-deposition regions from the second surface.    │
└─────────────────────────────────────────────────────────────┘
                                    ↓
┌─────────────────────────────────────────────────────────────┐
│  generating an organic material vapor by an evaporation source, wherein │
│   the organic material vapor contacts the first surface to form an organic │
│  material block on each of the deposition regions by the organic material │ ⌇ S22
│       vapor, and the organic material vapor does not form the organic   │
│              material block on the non-deposition regions.             │
└─────────────────────────────────────────────────────────────┘
```

FIG. 2

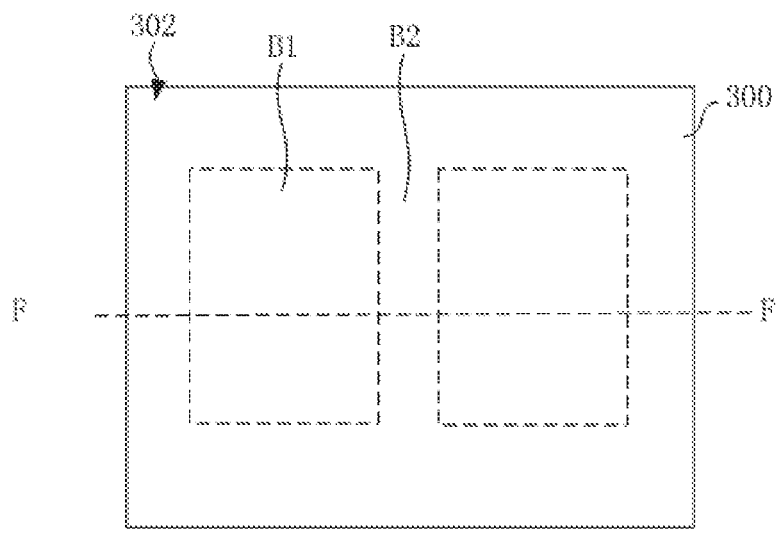

FIG. 3A

MANUFACTURING METHOD OF DISPLAY PANEL AND DISPLAY PANEL

FIELD OF INVENTION

The present disclosure relates to a field of display devices, and more particular to a manufacturing method of a display panel and a display panel.

BACKGROUND OF INVENTION

Compared with current mainstream liquid crystal display technologies, organic light-emitting diode (OLED) display technologies possess outstanding advantages, such as high contrast, wide color ranges, flexibility, thinness, and energy saving. In recent years, OLED display technologies have gradually become universal in the fields of mobile devices, such as smart phones and tablet computers; flexible wearable devices, such as smart watches; large-scale curved televisions; and white lighting. The develop trend of OLED is strong.

The current commercialized OLED display devices are mainly RGB three-color OLED display devices and display devices that white light OLEDs having color filters (CF).

Among current commercialized OLED display devices, RGB three-color OLED display devices are now widely used in mobile display devices. At present, the most common methods used for manufacturing OLEDs is vacuum evaporation. Organic light-emitting (EL) materials are heated in crucibles and changes from a solid state to a gaseous state. The organic light-emitting materials are then deposited on an opening of a corresponding pixel definition layer (PDL) disposed on a thin film transistor array (TFT Array) substrate through a hole of a fine metal mask (FMM). Conventional fine metal masks are mainly made of Invar alloy materials and are manufactured by double-sided photolithography and etching processes. The fine metal masks and mask frames are aligned to each other by a mask tension machine and they are welded on a mask support bracket by a laser beam. FIG. 1A is a schematic view of a fine metal mask which is welded on a mask support bracket. Please refer to FIG. 1A, the fine metal mask 10 is welded on the mask support bracket 11.

Fine metal mask technology is a determinant of resolution of a display device. FIG. 1B is a schematic top view of a fine metal mask 10. FIG. 1C is a schematic cross-sectional view along line A-A of FIG. 1B. Please refer to FIGS. 1B and 1C, the fine metal mask 10 has a plurality of openings 12. Organic materials are deposited on sites of a substrate corresponding to the openings 12 to form sub-pixels. FIG. 1D is a schematic view of vapor deposition of the sub-pixels using the fine metal mask, and FIG. 1E is an enlarged schematic view of a region C of FIG. 1D. Please refer to FIGS. 1D and 1E, the organic materials evaporated by an evaporation source 13 are deposited on the substrate 14 through the openings 12, thereby forming a sub-pixel 15 on the substrate 14. The evaporation regions of organic materials are indicated by a dashed line.

Technical Problems

The disadvantages are that during the vapor deposition process, a shadow area A is formed at both edges of the sub-pixel 15 because of parameters such as the shape and thickness of the openings 12. The shadow area A includes an outer shadow area A1 which is located on a left side of the edge of the openings 12, and an inner shadow area A2 which is located on a right side of the edge of the openings 12. Thicknesses of the sub-pixels in the shadow area A are not uniform and are gradually decreased in a gradient manner. In general cases, a width of the shadow area A is 5 micrometers or more. In order to avoid influences of the shadow area A to the display effect of the display device, the width of the sub-pixel 15 must be increased, which however limits the manufacturing of display devices with higher resolution. Generally, resolutions of conventional FMMs are difficult to exceed 250 ppi. With the increasing requirements for resolutions of display devices (such as above 300 ppi). The existing technologies which preform vacuum deposition with a fine metal mask are difficult to meet the requirements, and a temperature of the fine metal mask is increased during the evaporation process (for example, 5° C. or more). Meanwhile, the fine metal mask must be periodically cleaned and re-laid, which is prone to PPA precision change and increase production and maintenance costs. Therefore, it is necessary to develop a new manufacturing method of a display panel.

SUMMARY OF INVENTION

The present disclosure aims to solve the technical problems to provide a manufacturing method of a display panel and a display panel, which is applicable to manufacturing a high-resolution display panel.

In order to solve the above problems, the present disclosure provides a manufacturing method of a display panel, comprising steps of providing a substrate having a first surface and a second surface, wherein the first surface is disposed opposite to the second surface, and forming a plurality of deposition regions and a plurality of non-deposition regions alternately arranged on the first surface; providing a mask comprising a plurality of blocking regions and a plurality of hollow regions spaced apart from each other, wherein the blocking regions are disposed corresponding to the deposition regions and the hollow regions are disposed corresponding to the non-deposition regions; providing a light source to irradiate the mask, wherein the light source in the hollow region irradiates the non-deposition regions after passing through the hollow regions, and the light source in the blocking region is blocked by the blocking region; and generating an organic material vapor by an evaporation source, wherein the organic material vapor contacts the first surface to form an organic material block on each of the deposition regions by the organic material vapor, and the organic material vapor does not form the organic material block on the non-deposition regions, wherein an edge of a side of the organic material block protrudes from a boundary between the deposition regions and the non-deposition regions; wherein the manufacturing method further comprises an aligning step to adjust positions of the substrate and the mask, so that the blocking regions are disposed corresponding to the deposition regions, and the hollow regions are disposed corresponding to the non-deposition regions.

In an embodiment, each of the deposition regions is a sub-pixel region, each of the non-deposition regions is a non-sub-pixel region, and the organic material block which is disposed on each of the deposition regions is a sub-pixel.

In an embodiment, an edge of a side of the organic material block protrudes from a boundary between the deposition regions and the non-deposition regions, and a thickness of the material organic block is gradually decreased in each of the non-deposition regions.

In an embodiment, the light source is a laser light source.

In order to solve the above problems, the present disclosure further provides a manufacturing method of a display panel, comprising steps of: providing a substrate having a first surface and a second surface, wherein the first surface is disposed opposite to the second surface, and forming a plurality of deposition regions and a plurality of non-deposition regions alternately arranged on the first surface; providing a light source, wherein the light source irradiates the second surface and further irradiates the non-deposited region from the second surface; and generating an organic material vapor by an evaporation source, wherein the organic material vapor contacts the first surface to form an organic material block on each of the deposition regions by the organic material vapor, and the organic material vapor does not form the organic material block on the non-deposition regions.

In an embodiment, the manufacturing method further comprises steps of: providing a mask prior to the step of irradiating the non-sub-pixel region from the second surface, wherein the mask comprises a plurality of blocking regions and a plurality of hollow regions spaced apart from each other, the blocking regions are disposed corresponding to the deposition regions, the hollow regions are disposed corresponding to the non-deposition regions; and in the step of irradiating the non-deposition region from the second surface by the light source, the light source irradiates the mask and the hollow regions, wherein the light source in the hollow regions irradiates the non-deposited regions after passing through the hollow regions, and the light source in the blocking regions is blocked by the blocking regions.

In an embodiment, the manufacturing method further comprises an aligning step to adjust positions of the substrate and the mask, so that the blocking regions are disposed corresponding to the deposition regions, and the hollow regions are disposed corresponding to the non-deposition regions.

In an embodiment, in the step of forming the organic material block, an edge of a side of the organic material block protrudes from a boundary between the deposition regions and the non-deposition regions.

In an embodiment, each of the deposition regions is a sub-pixel region, each of the non-deposition regions is a non-sub-pixel region, and the organic material block which is disposed on each of the deposition regions is a sub-pixel.

In an embodiment, a side of the organic material block protrudes from a boundary between the deposition regions and the non-deposition regions, and a thickness of the material organic block is gradually decreased in each of the non-deposition regions.

In an embodiment, the light source is a laser light source.

The present disclosure also provides a display panel manufactured by the above method, comprising a substrate having a plurality of deposition regions and a plurality of non-deposition regions alternately disposed thereon, wherein an organic material block is disposed on the deposition region, a side of the organic material block protrudes from a boundary between the deposition regions and the non-deposition regions, and a thickness of the material organic block is gradually decreased in each of the non-deposition regions.

In an embodiment, the organic material block is a sub-pixel.

In an embodiment, the side of the organic material block is arc-shaped.

Beneficial Effects

Advantages of the present disclosure are that a light source selectively emits light onto the substrate to produce a thermal or photochemical effect in the regions irradiated by the light source which activates particles of organic material vapor, and prevents deposition of particles on those regions. The manufacturing method of the present disclosure avoids using a fine metal mask, which omits periodic mask-tensioning and cleaning processes, and reduces maintenance costs for mass production. Meanwhile, large shadow regions of edges of pixels caused by angles of evaporations can be avoided, and a pixel position accuracy (PPA) shift caused by raising temperature of the fine metal mask during the coating process can be prevented, and it is applicable to manufacture of high-resolution display panels.

DESCRIPTION OF DRAWINGS

FIG. 2 is an illustration of steps of a manufacturing method of a display panel of the present disclosure;

FIG. 3A-3D are process flow diagrams of a method of manufacturing method of a display panel of the present disclosure.

DETAILED DESCRIPTION OF PREFERRED EMBODIMENTS

Exemplary embodiments of manufacturing methods of display panels and display panels provided by the present disclosure will be further described in detail with the accompanying drawings and the specific embodiments.

The method for preparing the display panel and the concrete embodiments of the display panel provided by the present disclosure will be described in detail below with reference to the accompanying drawings.

FIG. 2 is an illustration of steps of a manufacturing method of a display panel of the present disclosure, and FIG. 3A-3D are process flow diagrams of a method of manufacturing method of a display panel of the present disclosure.

Figure 1A:
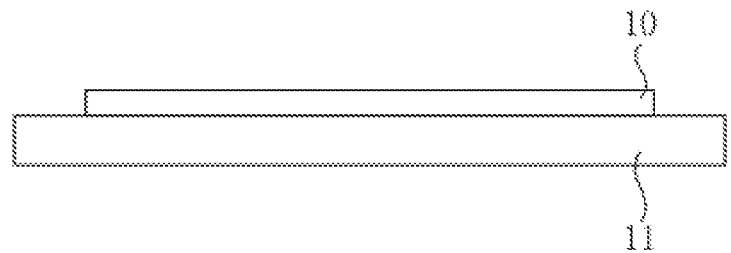
FIG. 1A is a schematic view of a fine metal mask which is welded on a mask support bracket.
Figure 1B:
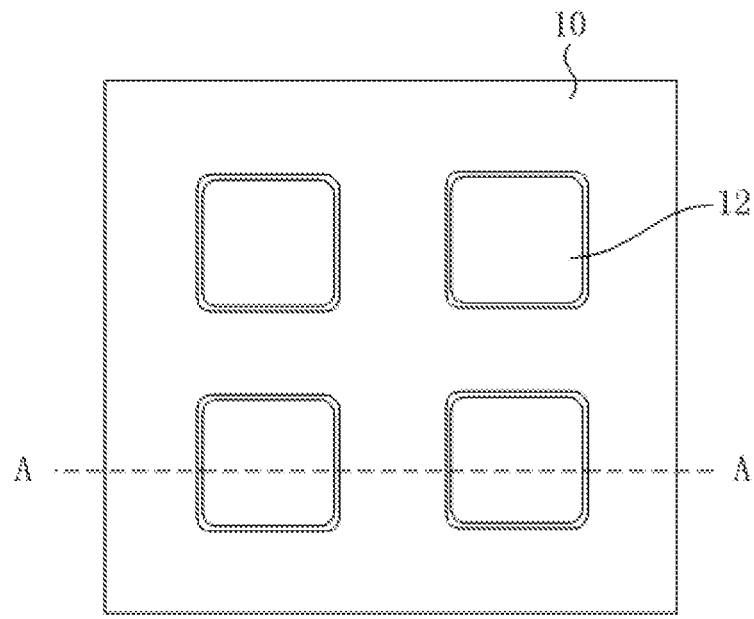
FIG. 1B is a schematic top view of a fine metal mask.
Figure 1C:
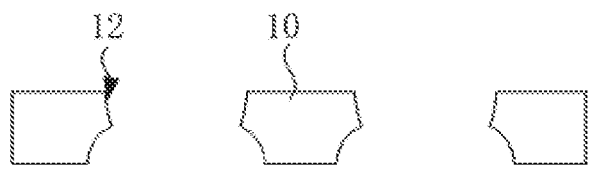
FIG. 1C is a schematic cross-sectional view along line A-A of FIG. 1B.
Figure 1D:
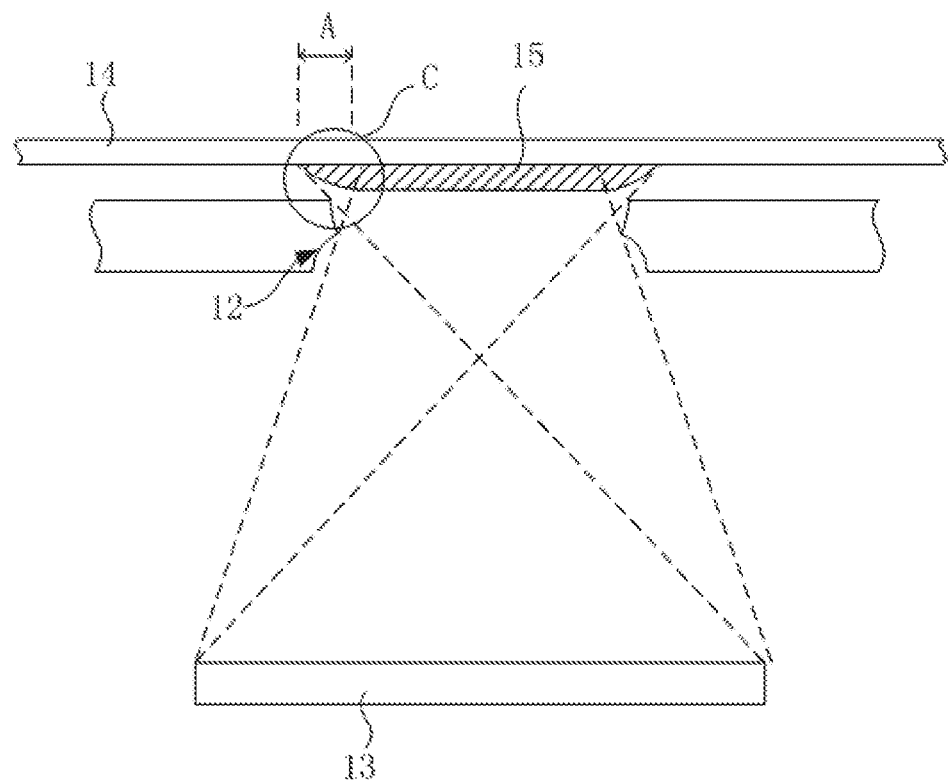
FIG. 1D is a schematic view of vapor deposition of the sub-pixels using the fine metal mask.
Figure 1E:
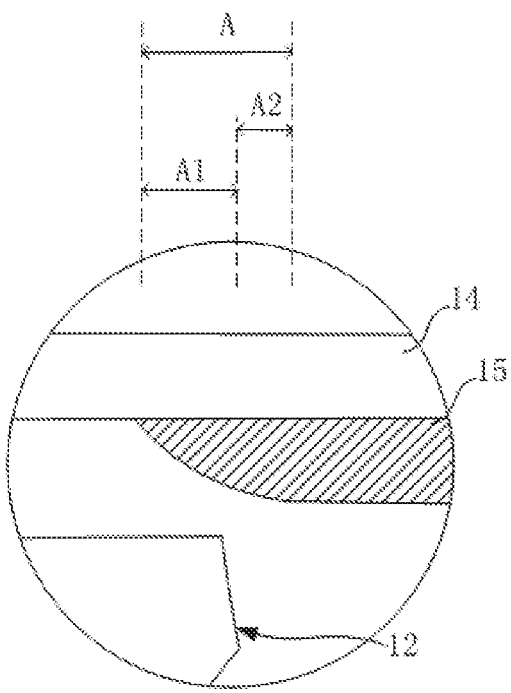
FIG. 1E is an enlarged schematic view of a region C of FIG. 1D.
Figure 3B:
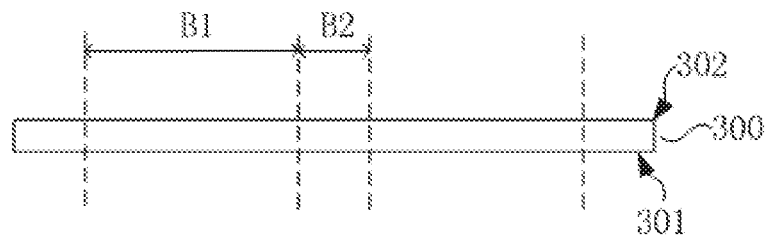

Please refer to step S20, FIG. 3A, and FIG. 3B. FIG. 3A is a top view and FIG. 3B is a cross-sectional view along line F-F of FIG. 3A. A substrate 300 is provided. The substrate 300 has a first surface 301 and a second surface 302. The first surface 301 is disposed opposite to the second surface 302, i.e., the first surface 301 and the second surface 302 are opposite surfaces. A plurality of deposition regions B1 and a plurality of non-deposition regions B2 alternately arranged on the first surface 301, i.e., the non-deposition region B2 is between two adjacent deposition regions B1. In the present embodiment, two of the deposition region B1 and one of the non-deposition regions B2 are schematically illustrated in FIGS. 3A and 3B.

Specifically, the substrate 300 is a conventional substrate used for manufacturing a display panel, for example, a glass substrate, a flexible substrate, etc. The arrangements of the deposition region B1 and the non-deposition region B2 may be set according to the concrete situations, for example, are set according to a function. Boundaries of the deposition region B1 and the non-deposition region B2 may be defined by an external structure or by height differences between the deposition region B1 and the non-deposition region B2.

For example, in the present embodiment, the substrate 300 is a glass substrate, which is a transparent structure and allows light to pass through. Conventional structures, such as a thin film transistor layer (not shown in the drawing), are deposited on the substrate 300. In other embodiments of the present disclosure, the substrate can also be a flexible substrate. In the present embodiment, the deposition region B1 is a sub-pixel region, and the non-deposition region B2 is a non-sub-pixel region. The boundary between the deposition region B1 and the non-deposition region B2 is defined by edges of hollow regions of the mask (indicated in FIG. 3C). In other embodiments of the present disclosure, a pixel defining layer is disposed on the substrate 300, i.e., the hollow region of the pixel defining layer is the deposition region B1, and the non-deposition region B2 is the region of the pixel defining layer other than the hollow region.

Figure 3C:
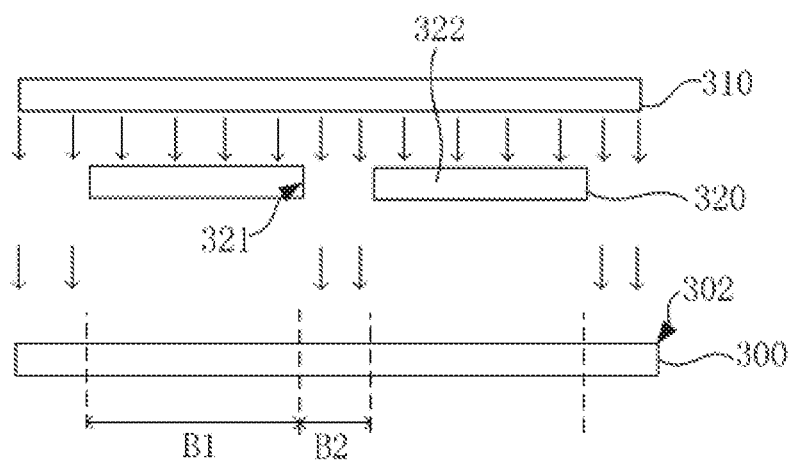

Please refer to step S21 and FIG. 3C, a light source 310 is provided to irradiate the second surface 302 and further irradiates the non-deposition region B2 through the second surface 302. That is, the light source 310 selectively irradiate the non-deposition region B2 through the substrate 300, and the light source 310 does not irradiate the deposition region B1. The light source 310 comprises, but is not limited to, a laser light source. In prior art, there are many methods can be employed such that the light source 310 to irradiates only the non-deposition region B2 without irradiating the deposition region B1, and people with ordinary skill in the art can select one from the existing methods.

In the present embodiment, the light source 310 irradiate the substrate 300 through a mask 320, i.e., the mask 320 is disposed between the light source 310 and the substrate 300. The mask 320 is a conventional photo mask in the art. The mask 320 has a plurality of hollow regions 321 and a plurality of blocking regions 322. The hollow regions 321 are disposed corresponding to the non-deposition regions B2, and the blocking regions are disposed corresponding to the deposition regions B1. That is, the positions which correspond to the non-deposition regions B2 are not blocked by the mask 320, and the positions which correspond to the deposition region B1 is blocked by the mask 320. The light emitted by the light source 310 is shown as arrows in the figure. The light emitted by the light source 310 irradiates the mask 320. Then, the light emitted from the light source 310 directly irradiate the substrate 300 from the hollow regions 321 and pass through the substrate 300 to irradiate the non-deposition region B2, while the light generated by the light source 310 is blocked by the mask 320 in the blocking region 322. Thus, the light irradiated on the blocking region 322 does not irradiate the substrate 300, i.e., it does not irradiate the deposition region B1.

Figure 3D:
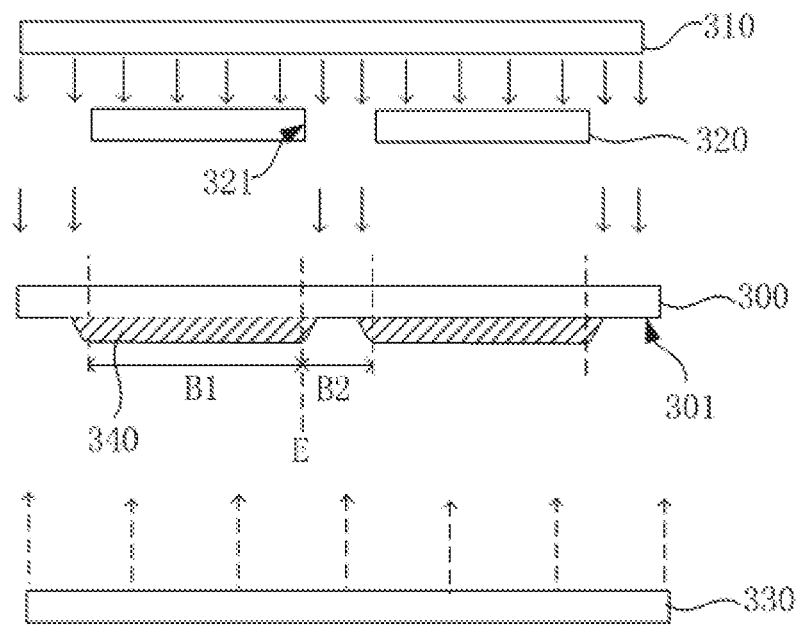

Please refer to step S22 and FIG. 3D, an evaporation source 330 generates an organic material vapor (shown by dashed line arrows in the figure), and the organic material vapor contacts with the first surface 301, i.e., the evaporation source 330 transports organic material vapor to the substrate 300 from a side of the first surface 301. The evaporation source 330 is a conventional structure of evaporation processes in the art which is not be described herein again. In this step, the light source 310 also acts on the substrate 300.

The organic material vapor is blocked by the substrate 300 and then the organic material vapor is deposited on the first surface 301 of the substrate 300. Specifically, the organic material vapor in the deposition region B1 nucleates and undergoes film formation to form an organic material block 340. The organic material vapor in the non-deposition region B2 does not form an organic material block. It is because the non-deposition region B2 is irradiated by the light source 310. After the organic material vapor reaches the non-deposition region B2, it is irradiated and activated by the light source 310. Therefore, the organic material vapor cannot nucleate and undergo film formation, i.e., the organic material vapor cannot deposit at the non-deposition region B2 and form a block of organic material. In the present embodiment, the organic material block 340 is a sub-pixel.

Using conventional mask technologies, the manufacturing method of a display panel of the present disclosure irradiates the mask 320 via a light source, such as a laser. The light of the light source 310 selectively irradiate the substrate 300 through the mask. The regions irradiated by the light source produces a thermal or a photochemical effect which activates particles of the vapor of the organic material and prevents the deposition of particles on those regions. The manufacturing method of the present disclosure avoids using a fine metal mask, which omits periodic mask-tensioning and cleaning processes, and reduces maintenance costs for mass production. Meanwhile, large shadow regions of edges of pixels caused by angles of evaporations can be avoided, and a pixel position accuracy (PPA) shift caused by raising temperature of the fine metal mask during the coating process can be prevented, and it is applicable to manufacture of high-resolution display panels.

Further, in an embodiment, the manufacturing method further includes an aligning step to adjust positions of the substrate 300 and the mask 320, so that the blocking regions 322 are disposed corresponding to the deposition regions B1, and the hollow regions 321 are disposed corresponding to the non-deposited regions B2. The method for adjusting is a conventional method in the art. For example, the alignment system of each of the substrate 300 and the mask 320 can be employed to perform the adjustment, and details are not described herein.

Further, please refer to FIG. 3D. In an embodiment, in the step of forming the organic material block 340, the side of the organic material block 340 protrudes from a boundary E between the deposition region B1 and the non-deposition region B2, i.e., the organic material block 340 covers a part of the non-deposition region B2 in addition to the deposition region B1. Edges of the hollow region 321 is also a boundary between the deposition region B1 and the non-deposition B2. It is because the light of the light source 310 is blocked by the edge of the hollow region 321 of the mask. Therefore, the irradiation intensity of the light source 310 is reduced at the edge of the hollow region 321, and a portion of the particles in the organic material vapor is not activated, thereby depositing thereon. Because the intensity of the light source is gradually increased from the edge of the hollow region 321 to the center of the hollow region 321, the amount of the organic material vapor that can be deposited in the non-deposited region B2 become less and less. The thickness of the organic material block 340 in the non-deposited region B2 is decreased, i.e., a side of the organic material block 340 is arc-shaped.

Figure 4:
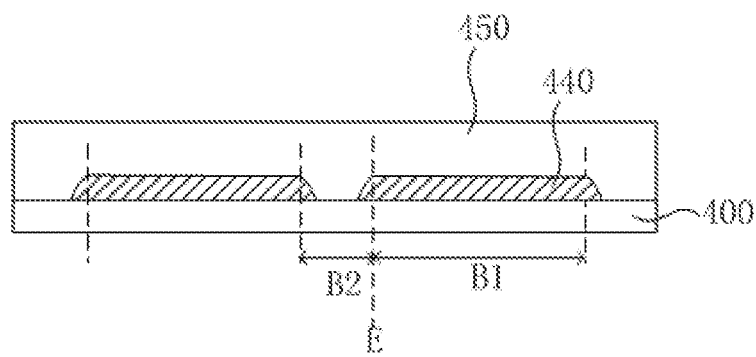
FIG. 4 is a schematic structural view of a display panel of the present disclosure.

The present disclosure also provides a display panel manufactured by the above method. FIG. 4 is a schematic structural view of a display panel of the present disclosure. Please refer to FIG. 4, the display panel comprises a substrate 400. The substrate 400 is a general substrate of a display panel, such as a glass substrate, a flexible substrate, etc. In the present embodiment, the substrate 400 is a glass substrate. General structures, such as a thin film transistor layer, are disposed on the substrate 400.

The substrate 400 has a plurality of deposition regions B1 and a plurality of non-deposition regions B2 alternately disposed thereon. Organic material blocks 440 are disposed on the deposition regions B1. In the present embodiment, the organic material block 440 is a sub-pixel. A side of the organic material block 440 protrudes from a boundary E between the deposition region B1 and the non-deposition region B2. That is, the organic material block 440 covers a portion of the non-deposition region B2 in addition to the deposition region B1. The boundary between the deposition region B1 and the non-deposition region B2 is determined by processes thereof. In the present embodiment, the boundary between the deposition region B1 and the non-deposition region B2 is the edge of the hollow region of the mask used when manufacturing the display panel. At a portion of the organic material block 440 that protrudes from the boundary E, the thickness of the organic material block 440 is gradually decreased, and sides of the organic material block 440 are arc-shaped.

The display device further comprises a structure, such as a cover 450, etc. Other structures of the display panel are not described herein, and people skilled in the art should be able to obtain other structures of the display panel from the prior art.

The above descriptions are merely some exemplary embodiments of the present disclosure, and those skilled in the art may make various improvements and refinements without departing from the principle of the disclosure. All such modifications and refinements are covered by the present disclosure.

INDUSTRIAL APPLICABILITY

The subject matters of the present application can be manufactured and used in the industry therefore, they possess industrial applicability.

The invention claimed is:

1. A manufacturing method of a display panel, comprising steps of:
    providing a substrate having a first surface and a second surface, wherein the first surface is disposed opposite to the second surface, and forming a plurality of deposition regions and a plurality of non-deposition regions alternately arranged on the first surface;
    providing a mask comprising a plurality of blocking regions and a plurality of hollow regions spaced apart from each other, wherein the blocking regions are disposed corresponding to the deposition regions and the hollow regions are disposed corresponding to the non-deposition regions;
    providing a light source to irradiate the mask, wherein the light source in the hollow region irradiates the non-deposition regions after passing through the hollow regions, and the light source in the blocking region is blocked by the blocking region; and
    generating an organic material vapor by an evaporation source, wherein the organic material vapor contacts the first surface to form an organic material block on each of the deposition regions by the organic material vapor, and the organic material vapor does not form the organic material block on the non-deposition regions, wherein an edge of a side of the organic material block protrudes from a boundary between the deposition regions and the non-deposition regions;
    wherein the manufacturing method further comprises an aligning step to adjust positions of the substrate and the mask, so that the blocking regions are disposed corresponding to the deposition regions, and the hollow regions are disposed corresponding to the non-deposition regions.

2. The manufacturing method of a display panel according to claim 1, wherein each of the deposition regions is a sub-pixel region, each of the non-deposition regions is a non-sub-pixel region, and the organic material block which is disposed on each of the deposition regions is a sub-pixel.

3. The manufacturing method of a display panel according to claim 1, wherein a side of the organic material block protrudes from the boundary between the deposition regions and the non-deposition regions, and a thickness of the material organic block is gradually decreased in each of the non-deposition regions.

4. The manufacturing method of a display panel according to claim 1, wherein the light source is a laser light source.

5. A manufacturing method of a display panel, comprising steps of:
    providing a substrate having a first surface and a second surface, wherein the first surface is disposed opposite to the second surface, and forming a plurality of deposition regions and a plurality of non-deposition regions alternately arranged on the first surface;
    providing a light source and a mask, wherein the mask comprises a plurality of blocking regions and a plurality of hollow regions spaced apart from each other, the blocking regions are disposed corresponding to the deposition regions, the hollow regions are disposed corresponding to the non-deposition regions;
    irradiating the second surface and the non-deposition regions from the second surface by the light source, wherein the light source in the hollow regions irradiates the non-deposition regions after passing through the hollow regions, and the light source in the blocking regions is blocked by the blocking regions; and
    generating an organic material vapor by an evaporation source, wherein the organic material vapor contacts the first surface to form an organic material block on each of the deposition regions by the organic material vapor, and the organic material vapor does not form the organic material block on the non-deposition regions.

6. The manufacturing method of a display panel according to claim 5, wherein the manufacturing method further comprises an aligning step to adjust positions of the substrate and the mask, so that the blocking regions are disposed corresponding to the deposition regions, and the hollow regions are disposed corresponding to the non-deposition regions.

7. The manufacturing method of a display panel according to claim 5, wherein in the step of forming the organic material block, an edge of a side of the organic material block protrudes from a boundary between the deposition regions and the non-deposition regions.

8. The manufacturing method of a display panel according to claim 5, wherein each of the deposition regions is a sub-pixel region, each of the non-deposition regions is a non-sub-pixel region, and the organic material block which is disposed on each of the deposition regions is a sub-pixel.

9. The manufacturing method of a display panel according to claim 5, wherein a side of the organic material block protrudes from a boundary between the deposition regions and the non-deposition regions, and a thickness of the material organic block is gradually decreased in each of the non-deposition regions.

10. The manufacturing method of a display panel according to claim 5, wherein the light source is a laser light source.

11. A display panel formed by the manufacturing method of claim 5, comprising:

a substrate having a plurality of deposition regions and a plurality of non-deposition regions alternately disposed thereon, wherein an organic material block is disposed on the deposition region, a side of the organic material block protrudes from a boundary between the deposition regions and the non-deposition regions, and a thickness of the material organic block is gradually decreased in each of the non-deposition regions.

12. The manufacturing method of a display panel according to claim 11, wherein the organic material block is a sub-pixel.

13. The manufacturing method of a display panel according to claim 11, wherein the side of the organic material block is arc-shaped.

* * * * *